(12) United States Patent
Umemura et al.

(10) Patent No.: US 8,779,791 B2
(45) Date of Patent: Jul. 15, 2014

(54) METHOD OF MANUFACTURING PROBE HAVING BOARDS CONNECTED BY MAGNETS

(75) Inventors: Yoshiharu Umemura, Kanagawa (JP); Katsushi Sugai, Saitama (JP)

(73) Assignee: Advantest Corporation, Tokyo (JP)

( * ) Notice: Subject to any disclaimer, the term of this patent is extended or adjusted under 35 U.S.C. 154(b) by 399 days.

(21) Appl. No.: 13/124,030

(22) PCT Filed: Apr. 7, 2010

(86) PCT No.: PCT/JP2010/056322
§ 371 (c)(1),
(2), (4) Date: May 25, 2011

(87) PCT Pub. No.: WO2011/125191
PCT Pub. Date: Oct. 13, 2011

(65) Prior Publication Data
US 2012/0038382 A1   Feb. 16, 2012

(51) Int. Cl.
*G01R 31/00* (2006.01)
(52) U.S. Cl.
USPC ............. 324/755.04; 324/756.07; 324/754.17
(58) Field of Classification Search
None
See application file for complete search history.

(56) References Cited

U.S. PATENT DOCUMENTS

| 2001/0030533 A1 | 10/2001 | Iwamoto et al. |
| 2003/0052561 A1 | 3/2003 | Rahman et al. |
| 2011/0121847 A1 | 5/2011 | Umemura et al. |

FOREIGN PATENT DOCUMENTS

| JP | 01128586 A | * 5/1989 | ............... H05K 1/14 |
| JP | 2001-049422 | 2/2001 | |
| JP | 2001-242187 | 9/2001 | |
| JP | 2002-303652 | 10/2002 | |
| JP | 2003-111322 | 4/2003 | |
| JP | 2008-042028 | 2/2008 | |
| JP | 2009-293943 | 12/2009 | |

OTHER PUBLICATIONS

Japan Office action, mail date is Sep. 3, 2013.
Japan Office action, mail date is Dec. 24, 2013.

* cited by examiner

*Primary Examiner* — Minh N Tang
(74) *Attorney, Agent, or Firm* — Greenblum & Bernstein, P.L.C.

(57) ABSTRACT

A probe includes a plurality of boards each of which has a plurality of magnets, a plurality of the boards include a first board and a second board laid on the first board, a plurality of the magnets include a plurality of first magnets provided with the first board and a plurality of second magnets provided with the second board and arranged so as to respectively face a plurality of the first magnets, and the first magnet and the second magnet facing each other are provided so that mutually different magnetic poles face each other.

6 Claims, 16 Drawing Sheets

METHOD OF MANUFACTURING PROBE HAVING BOARDS CONNECTED BY MAGNETS

TECHNICAL FIELD

The present invention relates to a probe for establishing electrical connection with electronic devices under test, such as semiconductor integrated circuit devices formed on a semiconductor wafer, (hereinafter also referred to representatively as IC devises), an electronic device testing apparatus comprising the probe, a board to be used for the probe, and a method of manufacturing the probe.

BACKGROUND ART

As a probe to be used for testing IC devises in a form of wafer, a probe is known in which a membrane, a first anisotropic conductive rubber, a first wiring board, a second anisotropic conductive rubber, and a second wiring board are stacked (refer to Patent Document 1, for example).

PRIOR ART DOCUMENT(S)

Patent Document(s)

[Patent Document 1] Japanese Published Patent Application No. 2009-293943

SUMMARY OF THE INVENTION

Problems to be Solved by the Invention

When stacking the membrane, the first anisotropic conductive rubber, the first wiring board, the second anisotropic conductive rubber, and the second wiring board, the above-mentioned probe requires a high accuracy in positioning them, thereby many man-hours for assembling are required.

Problems to be solved by the present invention include providing a probe which allows the assembling workability to be improved, an electronic device testing apparatus comprising the probe, a board to be used for the probe, and a method of manufacturing the probe.

Means for Solving the Problems (1) The probe according to the present invention is a probe for establishing an electrical connection with an electronic device under test, characterized in that the probe comprises a plurality of boards each of which has a plurality of magnets, a plurality of the boards include: a first board; and a second board laid on the first board, a plurality of the magnets include: a plurality of first magnets provided with the first board; and a plurality of second magnets provided with the second board and arranged so as to respectively face a plurality of the first magnets, and the first magnet and the second magnet facing each other are provided so that mutually different magnetic poles face each other (refer to claim 1).

In the above invention, the first board may be a membrane board having contactors and an insulating sheet for holding the contactors, or a first wiring board having a first insulating substrate and first terminals formed on the first insulating substrate, and the second board may be an anisotropic conductive board having an anisotropic conductive elastic body and a frame for holding the anisotropic conductive elastic body, or a second wiring board having a second insulating substrate and second terminals formed on the second insulating substrate (refer to claim 2). Note that the second board may be enough to be directly laid on the first board, and may also be stacked above the first board or stacked below the first board.

In the above invention, the magnet may be a permanent magnet (refer to claim 3).

In the above invention, the magnet may be inserted into a penetrating opening formed in the board (refer to claim 4).

In the above invention, the magnets adjacent to each other may be provided so that mutually different magnetic poles are directed in a same direction (refer to claim 5).

In the above invention, a plurality of the magnets may be arranged so that the magnets are disposed annularly in the board (refer to claim 6).

In the above invention, the magnet may be a magnet obtained by magnetizing a magnetic material attached to the board (refer to claim 7).

(2) The electronic device testing apparatus according to the present invention is an electronic device testing apparatus for testing an electronic device under test, characterized in that the apparatus comprises: the above probe; a test head electrically connected to the probe; and a pressure reduction means which reduces pressure in a sealed space defined between the electronic device under test and the probe so as to electrically contact the electronic device under test and the probe (refer to claim 8).

(3) The board according to the present invention is a board to be used for a probe establishing an electrical connection with an electronic device under test, characterized in that the board comprises a plurality of magnets, and the magnets adjacent to each other are provided so that mutually different magnetic poles are directed in a same direction (refer to claim 9).

(4) The method of manufacturing a probe according to the present invention is a method of manufacturing the above probe, characterized in that the method comprises a stacking step for positioning the first board and the second board with each other and stacking the first and the second boards by making the first magnet and the second magnet face each other (refer to claim 10).

In the above invention, the method may comprise: an attaching step for attaching a magnetic material to the board; and a magnetization step for magnetizing the magnetic material attached to the board so as to form the magnet (refer to claim 11).

In the above invention, the attaching step may include inserting the magnetic material into a penetrating opening formed in the board (refer to claim 12).

In the above invention, the magnetization step may include magnetizing the magnetic materials adjacent to each other so that mutually different magnetic poles are directed in a same direction (refer to claim 13).

In the above invention, the attaching step may include arranging a plurality of the magnetic materials so that the magnetic materials are disposed annularly in the board (refer to claim 14).

In the above invention, the attaching step may include arranging a plurality of the magnetic materials so that the magnetic materials are disposed annularly in the board, and the magnetization step may include rotating the board so as to sequentially magnetize a plurality of the magnetic materials (refer to claim 15).

In the above invention, the first board may be a membrane board having contactors and an insulating sheet for holding the contactors, or a first wiring board having a first insulating substrate and first terminals formed on the first insulating substrate, and the second board may be a anisotropic conductive board having an anisotropic conductive elastic body and a frame for holding the anisotropic conductive elastic body, or a second wiring board having a second insulating substrate and second terminals formed on the second insulating substrate (refer to claim 16). Note that the second board may be enough to be directly laid on the first board, and may also be stacked above the first board or stacked below the first board.

Advantageous Effect of the Invention

According to the present invention, the first magnets and the second magnets attract with each other thereby automatically positioning the first board and the second board, and the assembling workability of probes may thus be improved.

EMBODIMENTS FOR CARRYING OUT THE INVENTION

Hereinafter, the first embodiment of the present invention will be described with reference to the drawings.

Figure 1:
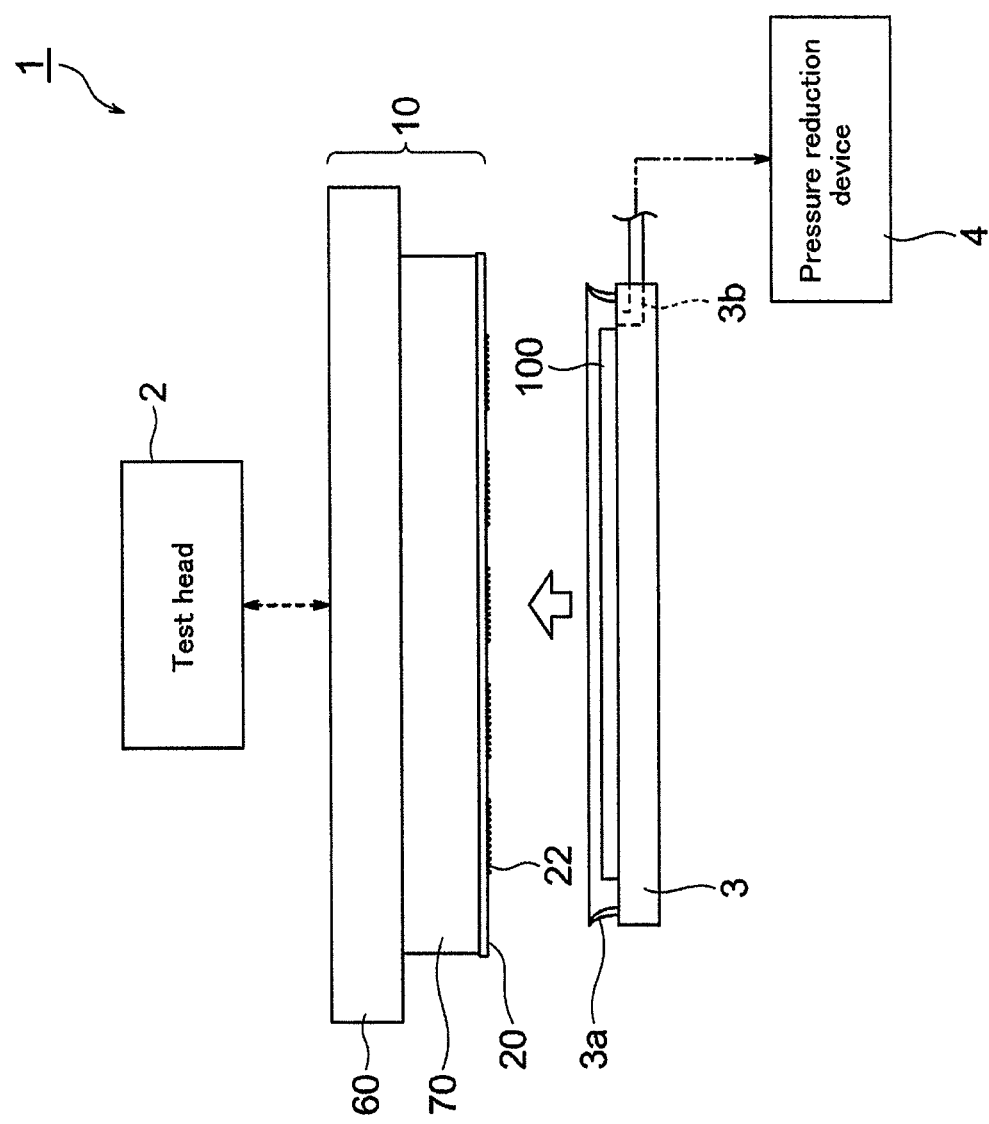
FIG. 1 is a schematic side elevational view illustrating a semiconductor wafer testing apparatus according to the embodiment of the present invention.

FIG. 1 is a schematic side elevational view illustrating a semiconductor wafer testing apparatus according to the present embodiment.

As shown in FIG. 1, the semiconductor wafer testing apparatus 1 (electronic device testing apparatus) according to the embodiment, which is an apparatus for testing IC devises formed on a semiconductor wafer 100, comprises a test head 2, a probe 10 (probe card), a wafer tray 3, and a pressure reduction device 4.

This semiconductor wafer testing apparatus 1, during the testing of IC devices, causes the semiconductor wafer 100 held on the wafer tray 3 to face the probe 10, and in this status reduces the pressure in the sealed space 80 (refer to FIG. 10) by means of the pressure reduction device 4. This allows the semiconductor wafer 100 to be pressed to the probe 10 and ensures the electrical conduction among components within the probe 10. Thereafter in this status a tester (not shown) inputs testing signals to and receives response signals from IC devices via the test head 2, thereby to perform the testing of IC devices. Note that the semiconductor wafer 100 may be pressed to the probe 10 in other manners than the pressure reduction (e.g. pressing by a compression manner).

Figure 2:
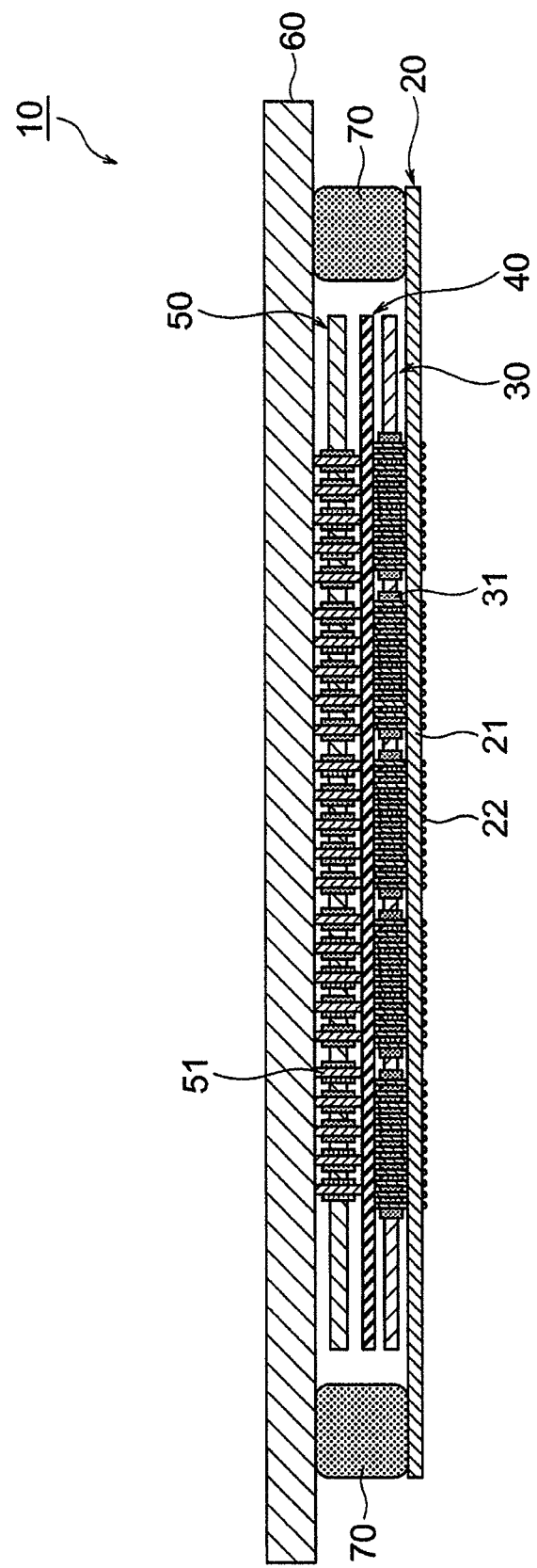
FIG. 2 is a cross sectional view of a probe according to the embodiment of the present invention.
Figure 3:
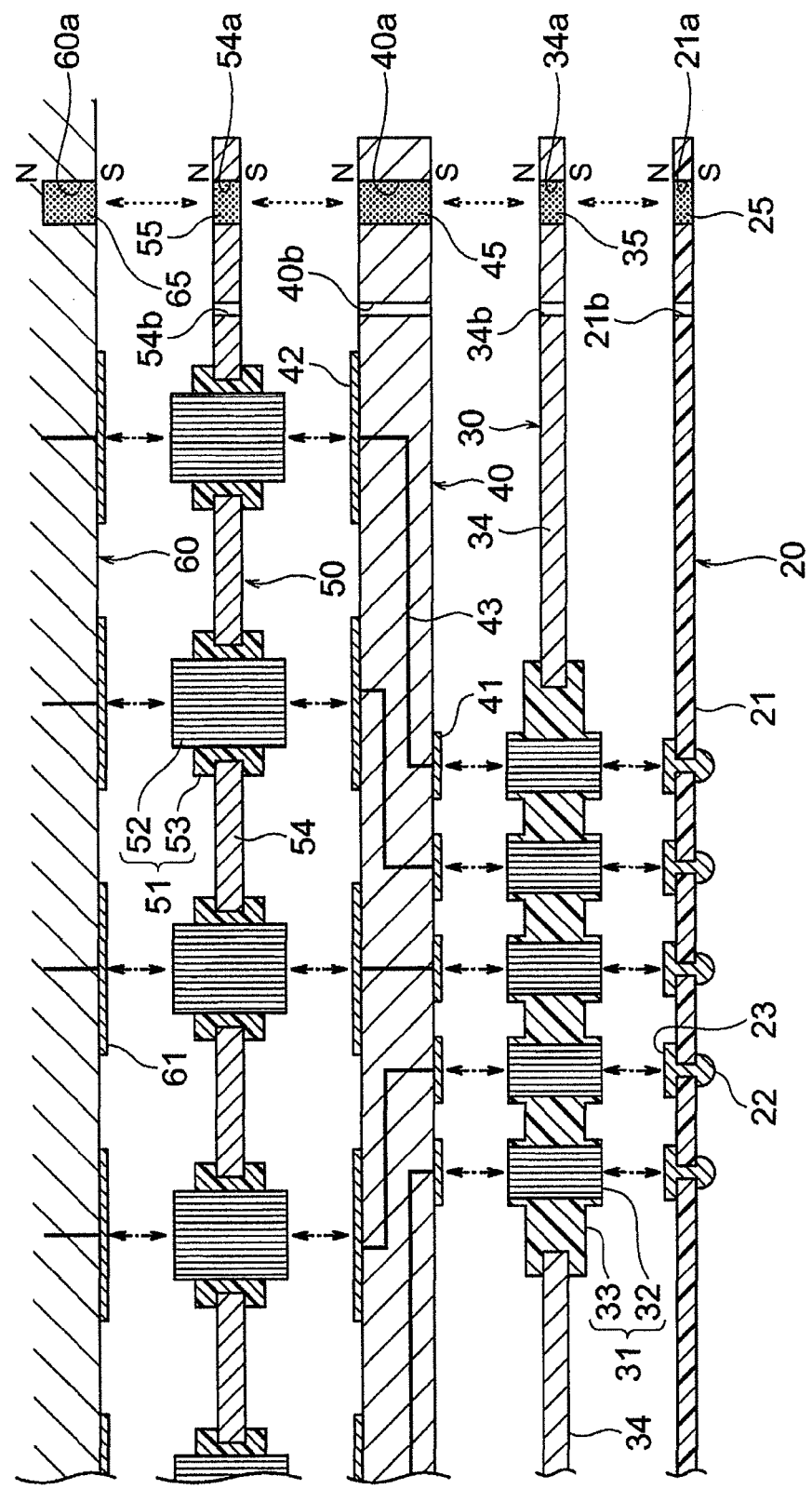
FIG. 3 is an exploded view of the probe according to the embodiment of the present invention.

FIG. 2 and FIG. 3 are a cross sectional view and an exploded view of the probe according to the present embodiment.

The probe 10 according to the present embodiment comprises: as shown in FIG. 2 and FIG. 3, a membrane board 20 having bumps 22 to electrically contact electrodes 110 (refer to FIG. 11) of IC devices formed on the semiconductor wafer 100; a performance board 60 to be electrically connected with the test head 2; a pitch conversion board 40 to convert pitches of conductive paths between the membrane board 20 and the performance board 60; a first anisotropic conductive board 30 to electrically connect the membrane board 20 and the pitch conversion board 40; and a second anisotropic conductive board 50 to electrically connect the pitch conversion board 40 and the performance board 60.

These boards 20 to 60 are stacked in the order of the membrane board 20, the first anisotropic conductive board 30, the pitch conversion board 40, the second anisotropic conductive board 50, and the performance board 60.

Note that the membrane board 20, the first anisotropic conductive board 30, the pitch conversion board 40, the second anisotropic conductive board 50, and the performance board 60 in the present embodiment correspond to one example of the boards in the present invention. Also note that the membrane board 20, the pitch conversion board 40, and the performance board 60 in the present embodiment correspond to one example of the first board in the present invention, and the first anisotropic conductive board 30 and the second anisotropic conductive board 50 in the present embodiment correspond to one example of the second board in the present invention.

Figure 4:
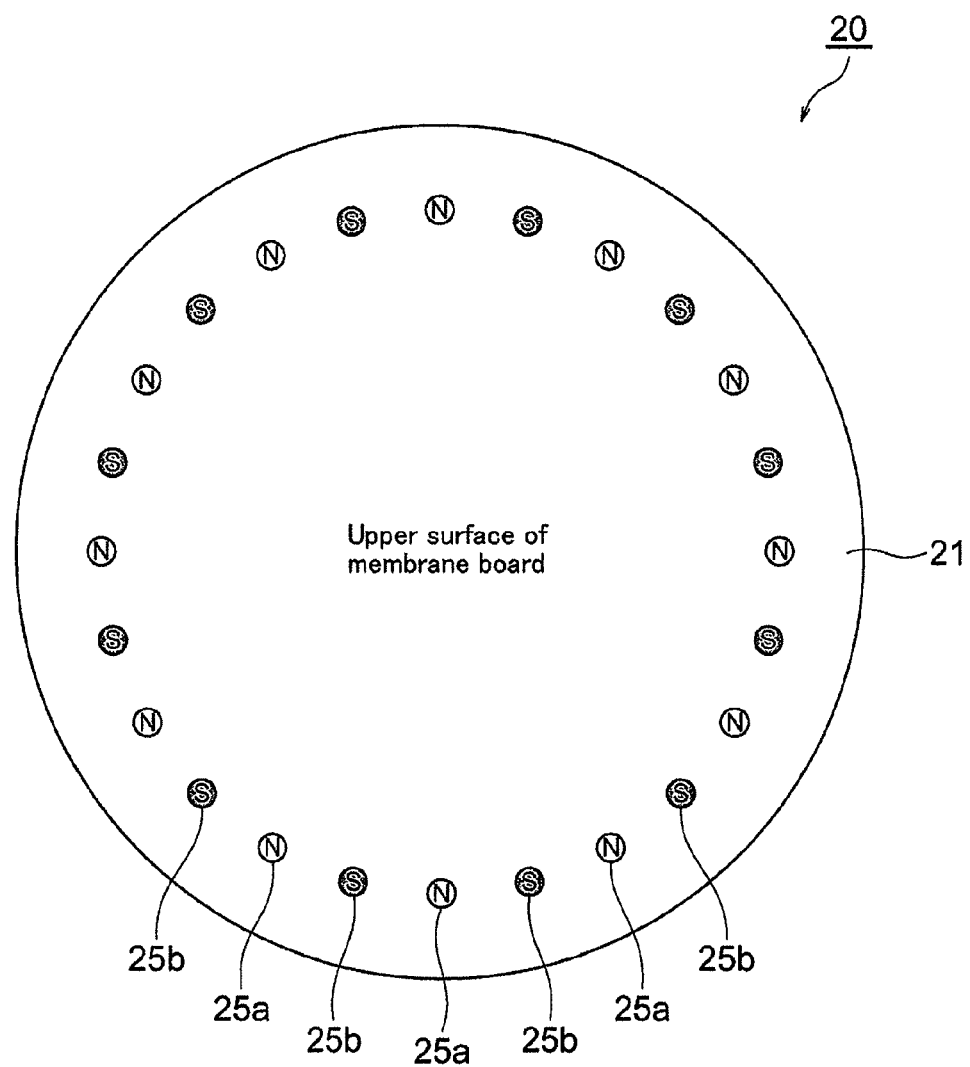
FIG. 4 is a plan view illustrating the layout of first magnets on a membrane board according to the embodiment of the present invention.

FIG. 4 is a plan view illustrating the layout of magnets on the membrane board of the probe according to the present embodiment, wherein the membrane board 20 is seen from above (i.e. seen from top down on the sheet of FIG. 2).

The membrane board 20, which is a substantially circular plate-like board, comprises: a sheet member 21 having flexibility and electrical insulation property; a considerable number of bumps 22 provided on the lower surface of the sheet member 21; and conductive patterns 23 provided on the upper surface of the sheet member 21, as shown in FIG. 2 and FIG. 3. As the material of which the sheet member 21 is composed, for example, polyimide, aramid fiber, and the like are mentioned.

The bumps 22, each of which is composed of conductive material such as nickel, have convex shapes projecting downward from the sheet member 21. These bumps 22 are arranged at the lower surface of the sheet member 21 so as to correspond to the electrodes 110 (refer to FIG. 11) on the semiconductor wafer 100. These bumps 22 are formed, for example, by growing nickel via plating process in the penetrating openings which is formed in the sheet member 21 via laser processing.

The conductive patterns 23 are formed, for example, by performing plating process, printing copper paste, or etching with respect to the upper surface of the sheet member 21. These conductive patterns 23 are arranged so as to correspond to the bumps 22, and thus the bumps 22 and the conductive patterns 23 are electrically connected with each other.

Further, the membrane board 20 according to the present embodiment has a number of (in the present example, 24 pieces of) first magnets 25 as shown in FIG. 3 and FIG. 4. Each of the first magnets 25 is, for example, a permanent magnetic having diameter of approximately 0.2 mm to 3 mm. These first magnets 25 are, as shown in FIG. 3, inserted into respective penetrating openings 21a formed in the sheet member 21, thereby being embedded in the sheet member 21. In addition, these first magnets 25 are arranged at the peripheral area of the sheet member 21 with substantially equal intervals along the circumferential direction thereof, as shown in FIG. 4. Note that dimensions of the first magnets 25 are not particularly limited.

Furthermore in the present embodiment, as shown in the same figure, adjacent first magnets 25 are provided in the sheet member 21 so that mutually different magnetic poles are directed in the same direction. Specifically, as shown in FIG. 4, first magnets 25a with N-poles directed upward are alternately arranged, and remaining first magnets 25b with S-poles directed upward are arranged therebetween. That is, the first magnets 25a having N-poles directed upward and the first magnets 25b having S-poles directed upward are disposed annularly and alternately at the peripheral area of the sheet member 21.

Figure 5:
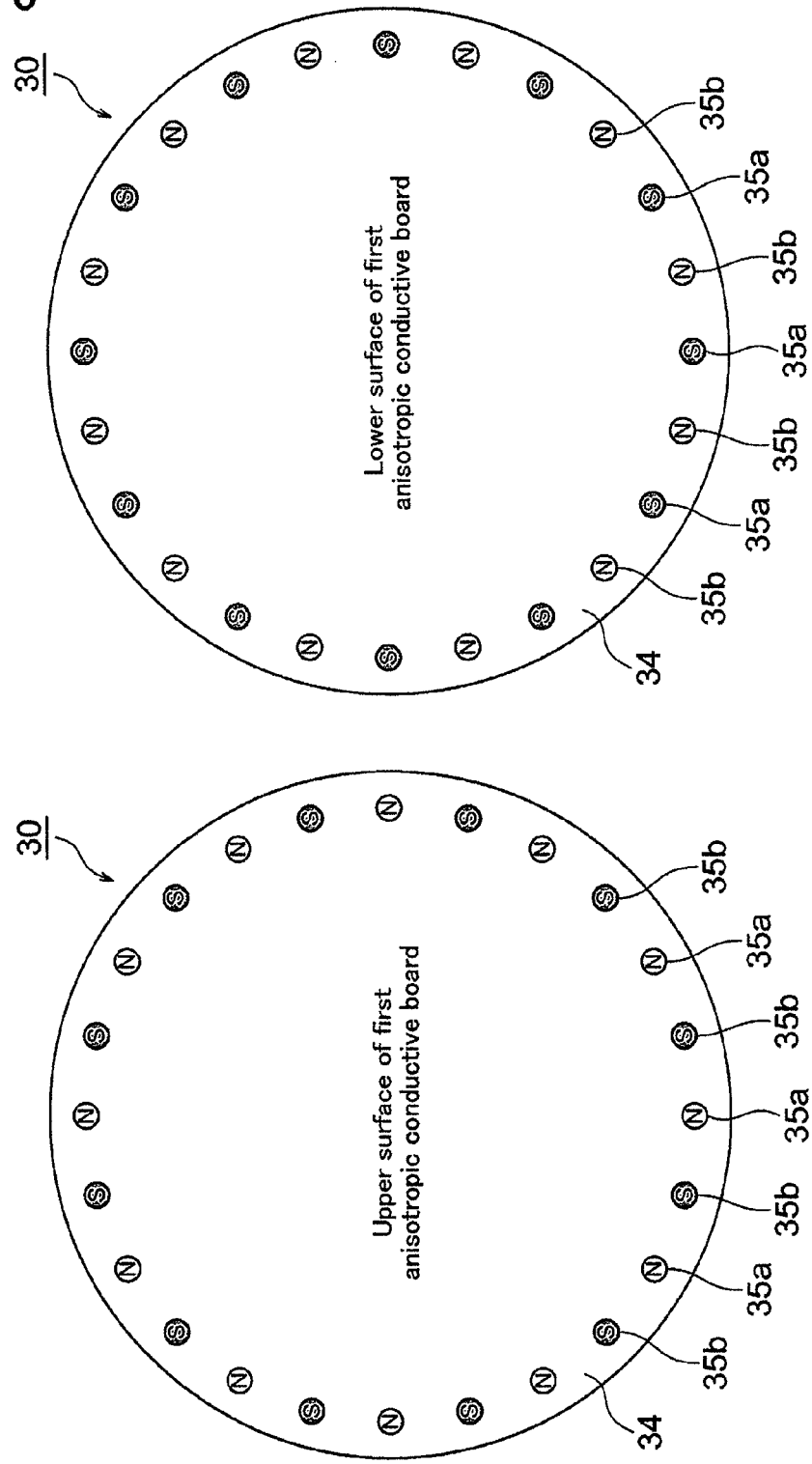
FIG. 5 depicts a top plan view and a bottom plan view illustrating the layout of second magnets in a first anisotropic conductive board of the probe according to the embodiment of the present invention.
Figure 6:
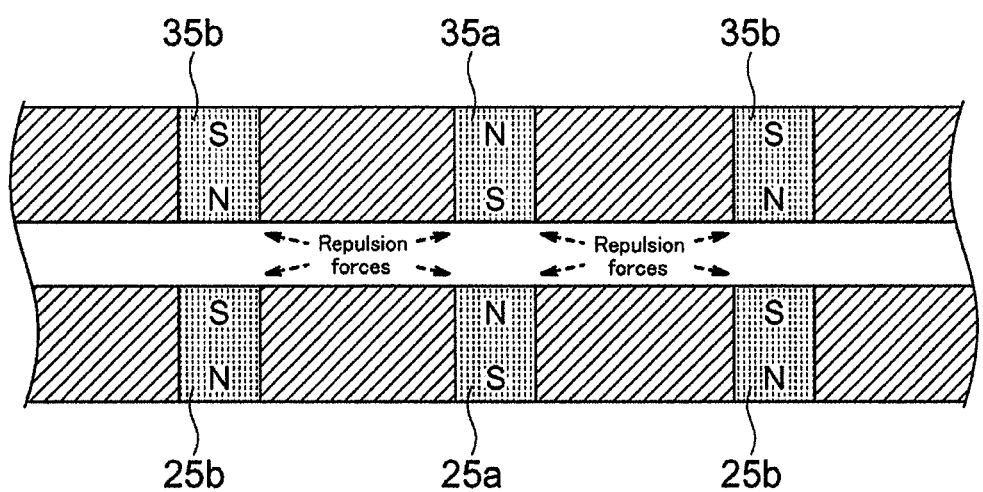
FIG. 6 is a cross sectional view illustrating the relationship between repulsion forces of first magnets and second magnets according to the embodiment of the present invention.

FIG. 5 depicts a top plan view and a bottom plan view illustrating the layout of magnets in the first anisotropic conductive board of the probe according to the present embodiment, and FIG. 6 is a cross sectional view illustrating the relationship between repulsion forces of the first magnets and the second magnets in the present embodiment. Note that, in FIG. 5, left side figure shows the top plan view in which the first anisotropic conductive board 30 is seen from above (i.e. seen from top down on the sheet of FIG. 2), and right side figure shows the bottom plan view in which the first anisotropic conductive board 30 is seen from below (i.e. seen from bottom up on the sheet of FIG. 2).

The first anisotropic conductive board 30 is a substantially circular plate-like board smaller than the membrane board 20, and comprises: first anisotropic conductive rubbers 31 having conductivity only in the thickness direction thereof; and a first frame 34 holding the first anisotropic conductive rubbers 31, as shown in FIG. 3.

Each of the first anisotropic conductive rubbers 31 comprises: particle dispersion parts 32 having conductive particles which are disposed in a insulator so as to be locally dispersed; and insulation parts 33 positioned around the particle dispersion parts 32 and formed from only of an insulator.

In the particle dispersion part 32, when that part 32 is compressed in the thickness direction, the conductive particles adjoining in the thickness direction come in contact with each other, whereby conduction in only the thickness direction can be achieved. These particle dispersion parts 32 are arranged to correspond to the conductive patterns 23 of the membrane board 20.

As the material of which the conductive particles of these particle dispersion parts 32 are composed, for example, iron, copper, zinc, chrome, nickel, silver, aluminum, or alloys thereof, etc. may be mentioned. Further, as the material of which the insulators of the particle dispersion parts 32 or the insulation parts 33 are composed, for example, silicone rubber, urethane rubber, natural rubber, and other insulating materials having elasticity may be mentioned. As such an anisotropic conductive rubber, PCR (registered trademark) available from JSR Microtech Inc. or the like may be used, for example.

On the other hand, as the material of which the first frame 34 is composed, for example, iron, copper, nickel, chrome, cobalt, magnesium, manganese, molybdenum, indium, lead, palladium, titanium, tungsten, aluminum, gold, platinum, silver, or alloys thereof, etc.

In the present embodiment, as shown in FIG. 3 and FIG. 5, a number of (in the present example, 24 pieces of) second magnets 35 are provided. These second magnets 35 are permanent magnets similar to the first magnets 25, and are inserted into penetrating openings 34a formed in the first frame 34. These second magnets 35 are arranged at the peripheral area of the first anisotropic conductive board 30 with substantially equal intervals along the circumferential direction thereof so as to face the first magnets 25 of the membrane board 20. The present embodiment allows an easy positioning of the membrane board 20 and the first anisotropic conductive board 30 by utilizing the first magnets 25 and the second magnets 35, as will be described later.

Also in this first anisotropic conductive board 30, adjacent second magnets 35 are provided in the first frame 34 so that mutually different magnetic poles are directed in the same direction, similarly to the above membrane board 20. Specifically, as shown in FIG. 5, second magnets 35a having N-poles directed upward and S-poles directed downward and the second magnets 35b having S-poles directed upward and N-poles directed downward are alternately disposed.

Figure 14:
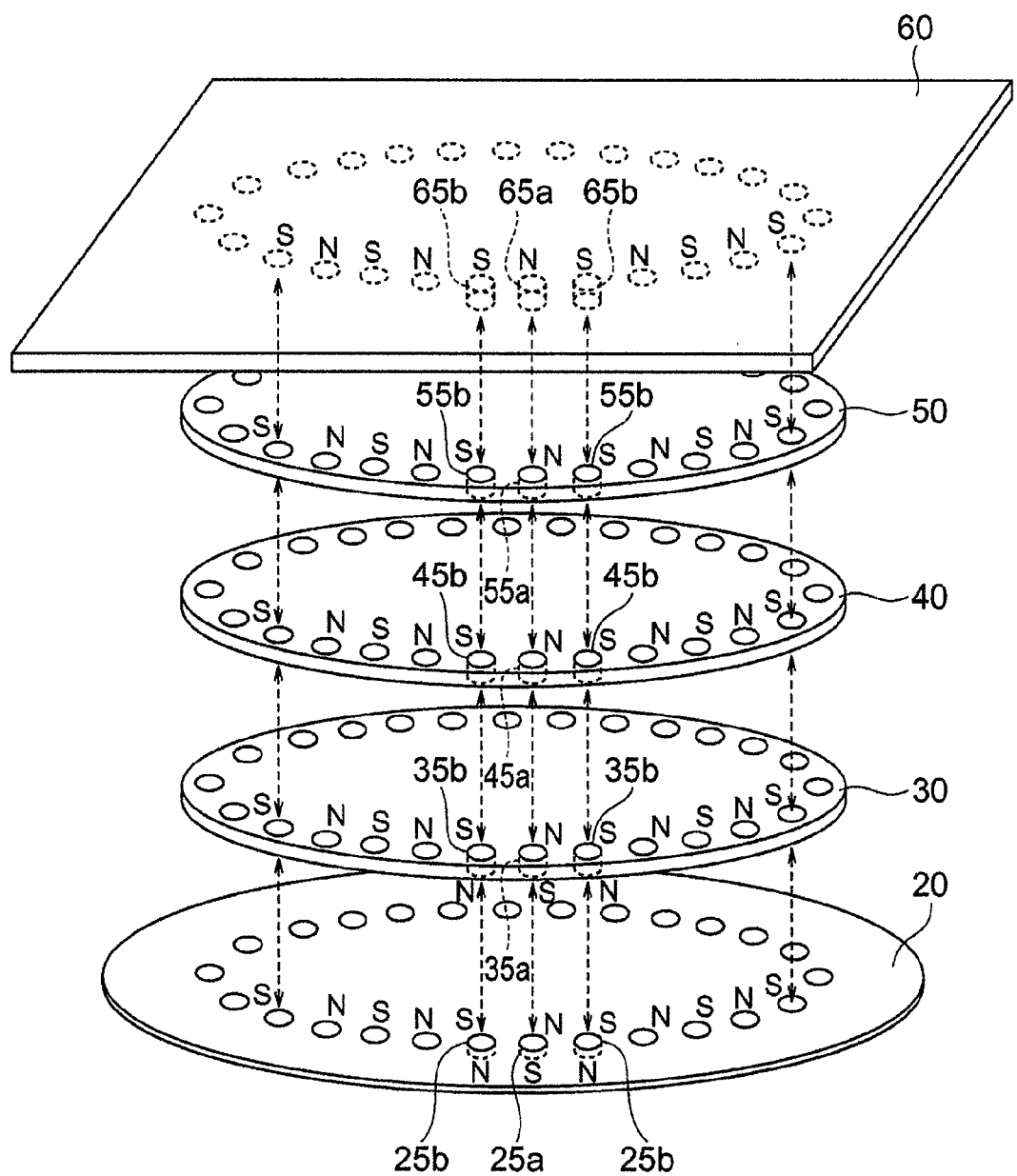
FIG. 14 is an exploded perspective view of the probe according to the embodiment of the present invention.

Furthermore in the present embodiment, in order for the first magnets 25 and the second magnets 35 to attract each other during the assembling of the probe 10, the second magnets 35a are arranged in the first anisotropic conductive board 30 so as to face the first magnets 25a, while the second magnets 35b are arranged in the first anisotropic conductive board 30 so as to face the first magnets 25b (refer to FIG. 14).

Thus, in the present embodiment, an opposed pair of the first magnet 25 and the second magnet 35 faces each other with different magnetic poles, while adjacent first magnets 25 in the membrane board 20 are arranged to have magnetic poles inverted with each other, and adjacent second magnets 35 in the first anisotropic conductive board 30 are also arranged to have magnetic poles inverted with each other.

Accordingly, as shown in FIG. 6, the accuracy of positioning of the membrane board 20 and the first anisotropic conductive board 30 are further improved by utilizing a repulsion force caused between each first magnet 25a (25b) and each second magnet 35b (35a) adjacent to the second magnet 35a (35b) facing that first magnet 25a (25b) and/or a repulsion force caused between each second magnet 35a (35b) facing each first magnet 25a (25b) and each first magnet 25b (25a) adjacent to that first magnet 25a (25b).

Figure 7:
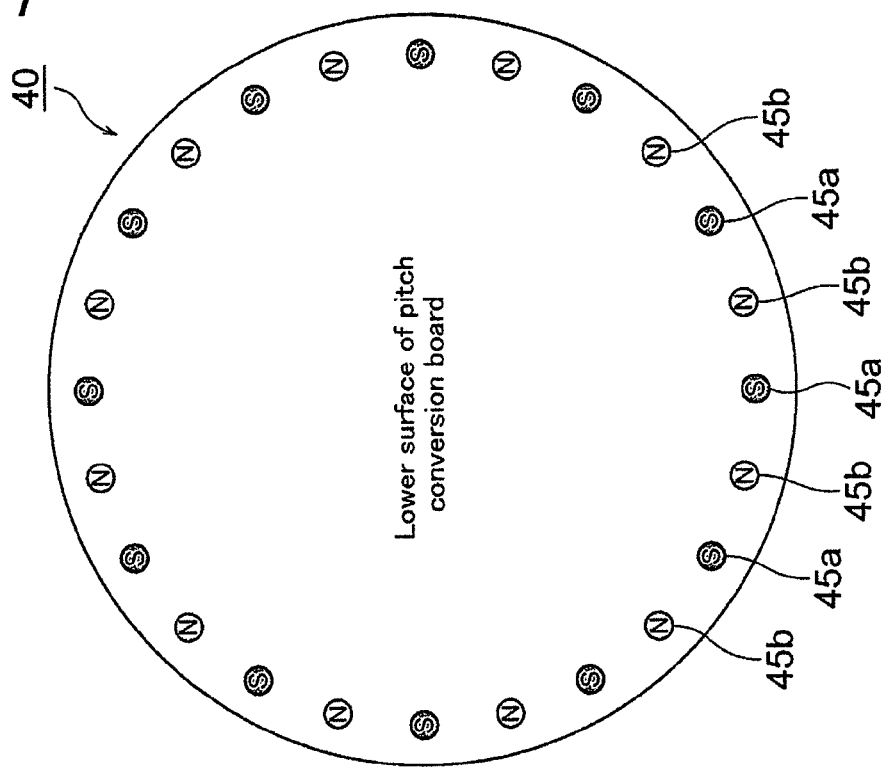
FIG. 7 depicts a top plan view and a bottom plan view illustrating the layout of third magnets in a pitch conversion board of the probe according to the embodiment of the present invention.
Figure 7:
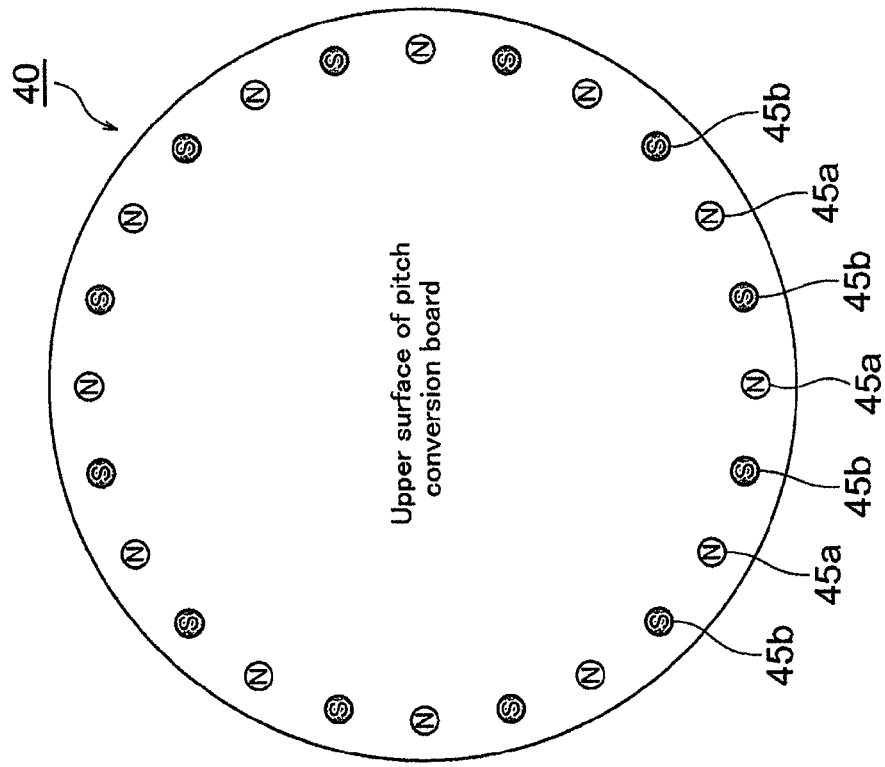

FIG. 7 depicts a top plan view and a bottom plan view illustrating the layout of third magnets in the pitch conversion board of the probe according to the present embodiment. Note that, in the same figure, left side figure shows the top plan view in which the pitch conversion board 40 is seen from above (i.e. seen from top down on the sheet of FIG. 2), and right side figure shows the bottom plan view in which the pitch conversion board 40 is seen from below (i.e. seen from bottom up on the sheet of FIG. 2).

The pitch conversion board 40 is a substantially circular plate-like board smaller than the membrane board 20, and is a rigid board such as a ceramic board, a silicon nitride board, a board interwoven with aramid fibers, a board obtained by laminating polyimide onto a core material in which aramid fibers are immersed in a resin or a core material composed of 42 alloy.

As shown in FIG. 3, the lower surface of this pitch conversion board 40 (the surface facing the first anisotropic conductive board 30) is provided thereon with first terminals 41 corresponding to the first anisotropic conductive rubbers 31. On the other hand, the upper surface of this pitch conversion board 40 (the surface facing the second anisotropic conductive board 50) is provided thereon with second terminals 42 corresponding to the second anisotropic conductive rubbers 51 (as will be described later). These terminals 41 and 42 are electrically connected with each other via wirings 43 provided in the pitch conversion board 40, wherein the pitch between the second terminals 42 is larger than the pitch between the first terminals 41.

In the present embodiment, as shown in FIG. 3 and FIG. 7, a number of (in the present example, 24 pieces of) third magnets 45 is provided. These third magnets 45 are permanent magnets similar to the first and second magnets 25 and 35, and are inserted into penetrating openings 40a formed in the pitch conversion board 40.

These third magnets 45 are arranged at the peripheral area of the pitch conversion board 40 with substantially equal intervals along the circumferential direction so as to face the second magnets 35 of the first anisotropic conductive board 30. The present embodiment allows an easy positioning of the first anisotropic conductive board 30 and the pitch conversion board 40 by utilizing the second magnets 35 and the third magnets 45.

Also in this pitch conversion board 40, adjacent third magnets 45 are provided in the pitch conversion board 40 so that mutually different magnetic poles are directed in the same direction, similarly to the membrane board 20 and the first anisotropic conductive board 30 described above. Specifically, as shown in FIG. 7, third magnets 45a having N-poles directed upward and S-poles directed downward and the third magnets 45b having S-poles directed upward and N-poles directed downward are alternately disposed.

Furthermore in the present embodiment, in order for the second magnets 35 and the third magnets 45 to attract each other during the assembling of the probe 10, the third magnets 45a are arranged in the pitch conversion board 40 so as to face the second magnets 35a, while the third magnets 45b are arranged in the pitch conversion board 40 so as to face the second magnets 35b (refer to FIG. 14).

Thus, in the present embodiment, an opposed pair of the second magnet 35 and the third magnet 45 faces each other with different magnetic poles, while adjacent second magnets 35 in the first anisotropic conductive board 30 are arranged to have magnetic poles inverted with each other, and adjacent third magnets 45 in the pitch conversion board 40 are also arranged to have magnetic poles inverted with each other.

Accordingly, not particularly shown, the accuracy of positioning of the first anisotropic conductive board 30 and the pitch conversion board 40 are further improved by utilizing a repulsion force caused between each second magnet 35a (35b) and each third magnet 45b (45a) adjacent to the third magnet 45a (55a) facing that second magnet 35a (35b) and/or a repulsion force caused between each third magnet 45a (45b) facing each second magnet 35a (35b) and each second magnet 35b (35a) adjacent to that second magnet 35a (35b).

Figure 8:
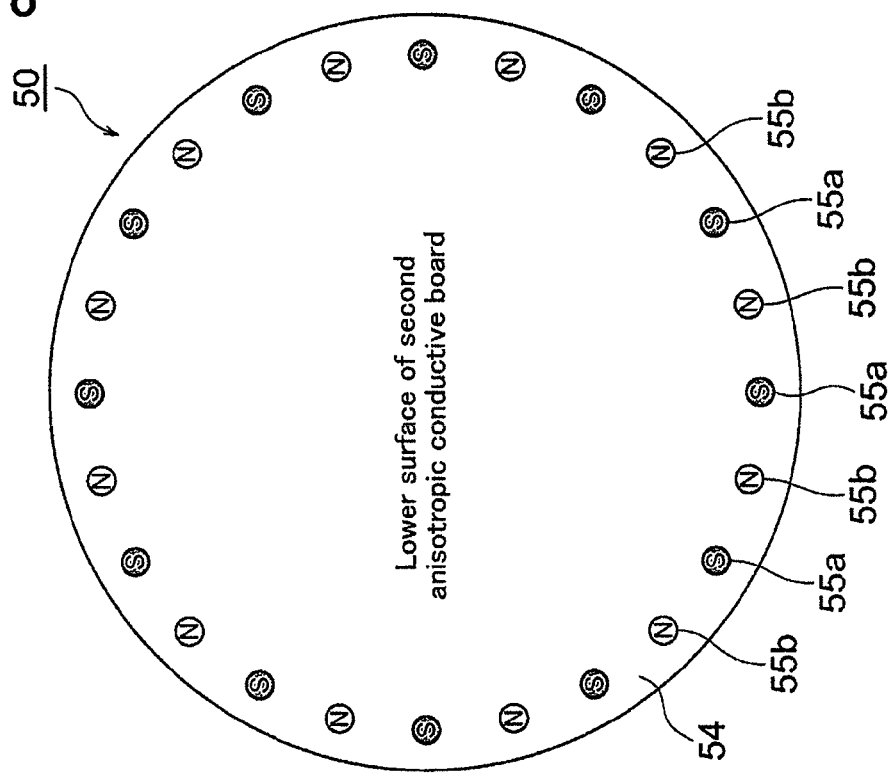
FIG. 8 depicts a top plan view and a bottom plan view illustrating the layout of fourth magnets in a second anisotropic conductive board of the probe according to the embodiment of the present invention.
Figure 8:
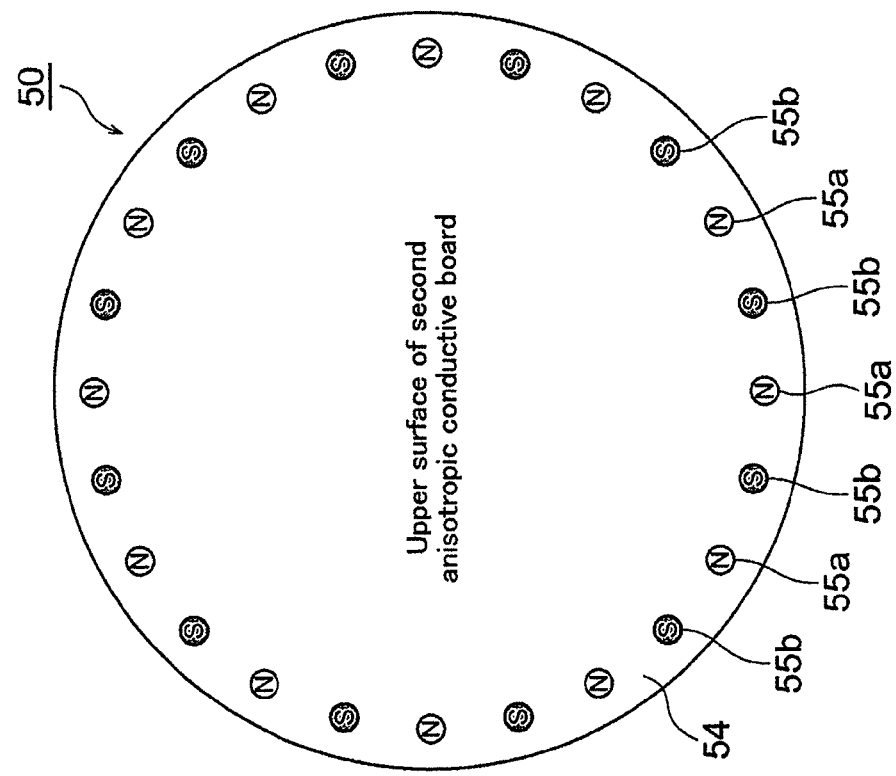

FIG. 8 depicts a top plan view and a bottom plan view illustrating the layout of fourth magnets in the second anisotropic conductive board of the probe according to the present embodiment. Note that, in the same figure, left side figure shows the top plan view in which the second anisotropic conductive board 50 is seen from above (i.e. seen from top down on the sheet of FIG. 2), and right side figure shows the bottom plan view in which the second anisotropic conductive board 50 is seen from below (i.e. seen from bottom up on the sheet of FIG. 2).

The second anisotropic conductive board 50 is a substantially circular plate-like board smaller than the membrane board 20, and comprises: as shown in FIG. 3 and similarly to the first anisotropic conductive board 30, second anisotropic conductive rubbers 51 having particle dispersion parts 52 and insulation units 53; and a second frame 54 which holds the second anisotropic conductive rubbers 51.

The second anisotropic conductive rubbers 51, which have the same structure as the first anisotropic conductive rubbers 31, are arranged so as to correspond to the first terminals 41 of the pitch conversion board 40. Although, as the material of which the second frame 54 are composed, the same materials as listed with respect to the first frame 34 may be used, it is preferred to use materials with larger thermal expansion coefficient than that of the material of which the first frame 34 is composed.

The second anisotropic conductive board 50 according to the present embodiment has, as shown in FIG. 3 and FIG. 8, a number of (in the present example, 24 pieces of) fourth magnets 55. These fourth magnets 55 are permanent magnets similar to the first to third magnets 25 to 45, and are inserted into penetrating openings 54a formed in the second frame 54. These fourth magnets 55 are arranged at the peripheral area of the second anisotropic conductive board 50 with substantially equal intervals along the circumferential direction so as to face the third magnets 45 of the pitch conversion board 40. The present embodiment allows an easy positioning of the pitch conversion board 40 and the second anisotropic conductive board 50 by utilizing the third magnets 45 and the fourth magnets 55, as will be described later.

Also in this second anisotropic conductive board 50, adjacent fourth magnets 55 are provided so that mutually different magnetic poles are directed in the same direction, similarly to the above-described boards 20 to 40. Specifically, as shown in FIG. 8, the fourth magnets 55a having N-poles directed upward and S-poles directed downward and the fourth magnets 55b having S-poles directed upward and N-poles directed downward are alternately disposed.

Furthermore in the present embodiment, in order for the third magnets 45 and the fourth magnets 55 to attract each other during the assembling of the probe 10, the fourth magnets 55a are arranged in the second anisotropic conductive board 50 so as to face the third magnets 45a, while the fourth magnets 55b are arranged in the second anisotropic conductive board 50 so as to face the third magnets 45b (refer to FIG. 14).

Thus, in the present embodiment, an opposed pair of the third magnet 45 and the fourth magnet 55 faces each other with different magnetic poles, while adjacent third magnets 45 in the pitch conversion board 40 are arranged to have magnetic poles inverted with each other, and adjacent fourth magnets 55 in the second anisotropic conductive board 50 are also arranged to have magnetic poles inverted with each other.

Accordingly, not particularly shown, the accuracy of positioning of the pitch conversion board 40 and the second anisotropic conductive board 50 are improved by utilizing a repulsion force caused between each third magnet 45a (45b) and each fourth magnet 55b (55a) adjacent to the fourth magnet 55a (55b) facing that third magnet 45a (45b) and/or a repulsion force caused between each fourth magnet 55a (55b) facing each third magnet 45a (45b) and each third magnet 45b (45a) adjacent to that third magnet 45a (45b).

Figure 9:
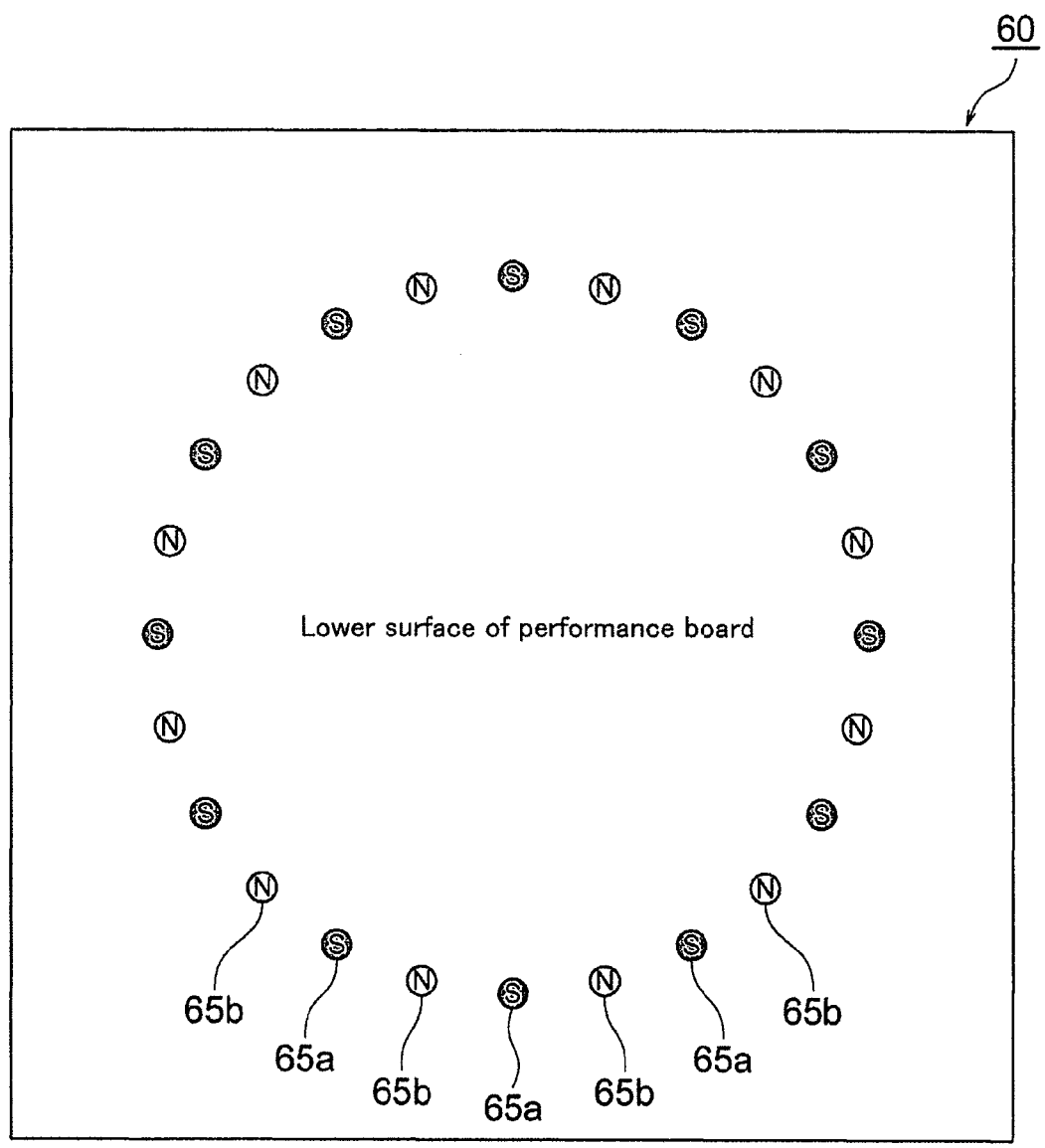
FIG. 9 depicts a bottom plan view illustrating the layout of fifth magnets in a performance board of the probe according to the embodiment of the present invention.

FIG. 9 is a bottom plan view illustrating the layout of fifth magnets in the performance board of the probe according to the present embodiment, wherein the performance board 60 is seen from below (i.e. seen from bottom up on the sheet of FIG. 2).

The performance board 60 is a substantially rectangular plate-like board as a whole, and is a rigid board composed of synthetic resin material such as glass epoxy resin, for example. As shown in FIG. 3, the lower surface of the performance board 60 (the surface facing the second anisotropic conductive board 50) is provided thereon with third terminals 61 corresponding to the second terminals 42. These third terminals 61 are formed by performing copper plating process, printing copper paste, or etching copper foil, etc. Further, although not particularly shown, the performance board 60 is electrically connected with pin electronics cards accommodated within the test head 2 via connectors and cables.

The performance board 60 according to the present embodiment has, as shown in FIG. 3 and FIG. 9, a number of (in the present example, 24 pieces of) fifth magnets 65. These fifth magnets 65 are permanent magnets similar to the first to fourth magnets 25 to 55, and are inserted into penetrating openings 60a formed in the performance board 60. These fifth magnets 65 are arranged at the peripheral area of the performance board 60 with substantially equal intervals along a circumferential direction so as to face the fourth magnets 55 of the second anisotropic conductive board 50. The present embodiment allows an easy positioning of the second anisotropic conductive board 50 and the performance board 60 by utilizing the fourth magnets 55 and the fifth magnets 65, as will be described later.

Also in this performance board 60, adjacent fifth magnets 65 are provided so that mutually different magnetic poles are directed in the same direction, similarly to the above-described boards 20 to 50. Specifically, as shown in FIG. 9, the fifth magnets 65a having S-poles directed downward and the fifth magnets 65b having N-poles directed downward are alternately disposed.

Furthermore in the present embodiment, in order for the fourth magnets 55 and the fifth magnets 65 to attract each other during the assembling of the probe 10, the fifth magnets 65a are arranged in the performance board 60 so as to face the fourth magnets 55a, while the fifth magnets 65b are arranged in the performance board 60 so as to face the fourth magnets 55b (refer to FIG. 14).

Thus, in the present embodiment, an opposed pair of the fourth magnet 55 and the fifth magnet 65 faces each other with different magnetic poles, while adjacent fourth magnets 55 in the second anisotropic conductive board 50 are arranged to have magnetic poles inverted with each other, and adjacent fifth magnets 65 in the performance board 60 are also arranged to have magnetic poles inverted with each other.

Accordingly, not particularly shown, the accuracy of positioning of the second anisotropic conductive board 50 and the performance board 60 are improved by utilizing a repulsion force caused between each fourth magnet 55a (55b) and each fifth magnet 65b (65a) adjacent to the fifth magnet 65a (65b) facing that fourth magnet 55a (55b) and/or a repulsion force caused between each fifth magnet 65a (65b) facing each fourth magnet 55a (55b) and each fourth magnet 55b (55a) adjacent to that fourth magnet 55a (55b).

As shown in FIG. 2, a ring-shaped first sealing member 70 is provided so as to cover between the peripheral area of the upper surface of the membrane board 20 and the lower surface of the performance board 60. This first sealing member 70 is composed of a material, such as silicone rubber, which is elastically deformable and has remarkable sealing ability, and the first sealing member 70 encloses the first anisotropic conductive board 30, the pitch conversion board 40, and the second anisotropic conductive board 50.

The probe 10 having the above configuration is, as shown in FIG. 1, electrically connected with the test head 2 via connectors and cables (both not shown).

On the other hand, the wafer tray 3 is positioned holding the wafer under test 100 by suction is positioned below the probe 10. This wafer tray 3 is movable in the X-Y-Z directions and rotatable around the Z axis using a moving apparatus particularly not shown, and is capable of moving the held semiconductor wafer 100 to a position facing the probe 10.

Further, a second sealing member 3a is provided at the peripheral area of the wafer tray 3 across the entire circumference. This second sealing member 3a is composed of a material, such as silicone rubber, which is elastically deformable and has remarkable sealing ability, and when the wafer tray 3 approaches the probe 10 and the second sealing member 3a closely contacts the membrane board 20, then the wafer tray 3, the sealing members 70 and 3a, the membrane board 20, and the performance board 60 form a sealed space 80 (refer to FIG. 10) which includes the first and second anisotropic conductive board 30 and 50 and the pitch conversion board 40. Note that the space defined by the first sealing member 70 and the space defined by the second sealing member 3a are connected with each other through penetrating openings 21b, 34b, 40b, and 54b (refer to FIG. 3).

As shown in FIG. 1, a communicating path 3b with one end opening at the sealed space 80 and the other end opening at the side surface of the wafer tray 3 is formed inside the wafer tray 3, a pressure reduction device 4 is connected to the other end of the communicating path 3b via a pipe 3c.

Figure 10:
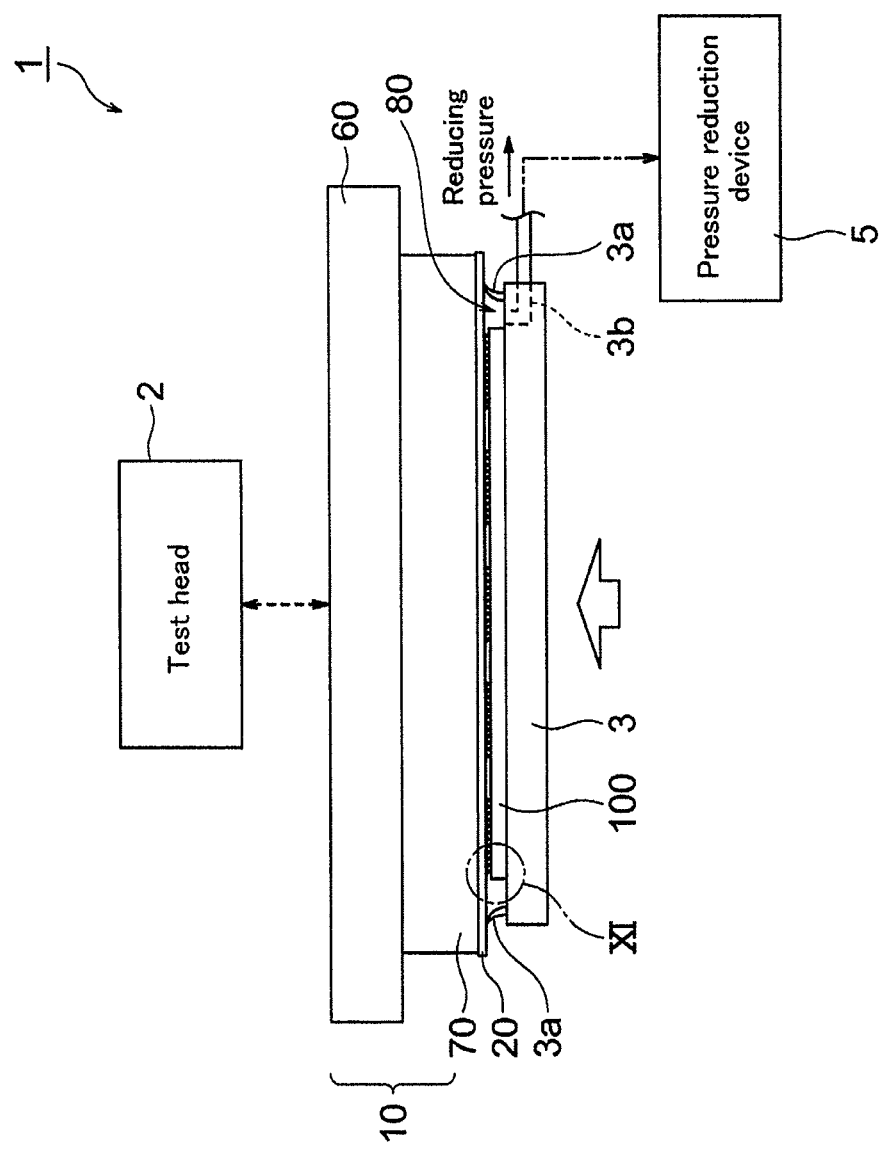
FIG. 10 is a schematic side elevational view illustrating the condition where the semiconductor wafer testing apparatus is testing IC devices, according to the embodiment of the present invention.
Figure 11:
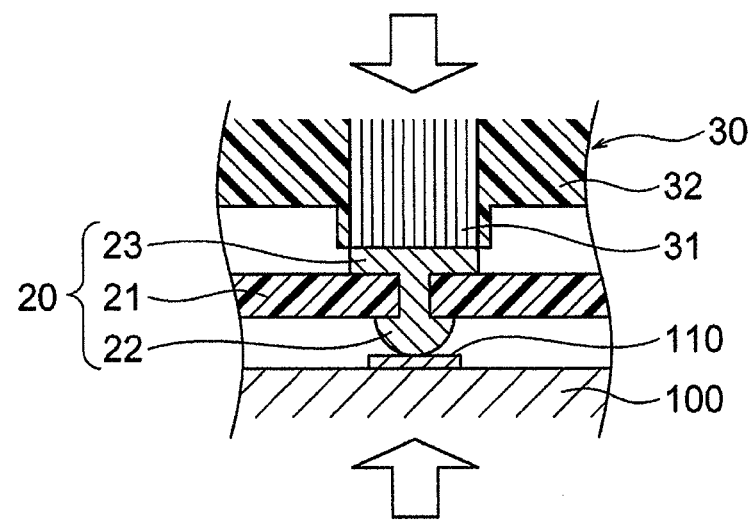
FIG. 11 is an enlarged cross sectional view of the XI area of FIG. 10.

FIG. 10 is a schematic side elevational view illustrating the condition where the semiconductor wafer testing apparatus according to the present embodiment is testing IC devices, and FIG. 11 is an enlarged cross sectional view of the XI area of FIG. 10.

As shown in FIG. 10, in the status where the wafer tray 3 faces the probe 10 and the second sealing member 3a is close contact with the lower surface of the membrane board 20, if the pressure reduction device 4 reduces the air pressure within the sealed space 80, then the first sealing member 70 is deformed, the first and second anisotropic conductive rubbers 31 and 51 of the first and second anisotropic conductive boards 30 and 50 are respectively compressed, and the bumps 22 of the membrane board 20 are electrically conducted with the third terminals 61 of the performance board 60 via the first anisotropic conductive board 30, the pitch conversion board 40, and the second anisotropic conductive board 50.

At the same time, the reducing air pressure within the sealed space 80 by the pressure reduction device 4 allows the second sealing member 3a to be deformed thereby causing the wafer tray 3 to be further close to the probe 10, and thus the bumps 22 of the membrane board 20 come contact with the electrodes 110 on the wafer 100 under test as shown in FIG. 11.

In this status, the tester inputs testing signals to IC devices and receives response signals from them via the test head 2 thereby to test IC devices. Note that, in the present embodiment, the pressure reduction device 4 reduces the air pressure within the sealed space 80 so that the pressure within the sealed space 80 becomes to be reduced to −10 [kPa] to −100 [kPa] compared with the atmospheric pressure.

Figure 12:
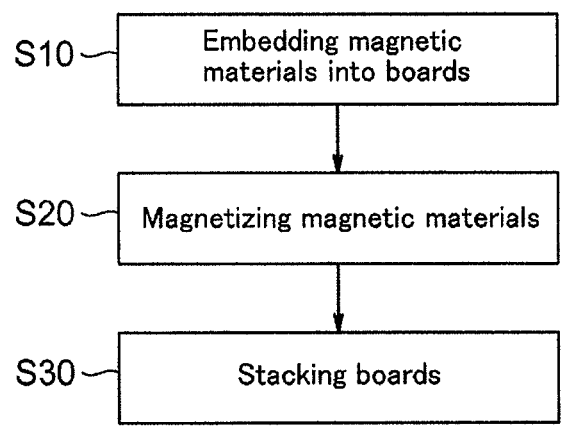
FIG. 12 is a flowchart illustrating a method of manufacturing a probe according to the embodiment of the present invention.

Hereinafter, the method of manufacturing the probe 10 as previously described will be explained with reference to FIG. 12. FIG. 12 is a flowchart illustrating the method of manufacturing a probe according to the present embodiment, FIG. 13 is a diagram illustrating a method for magnetizing magnetic materials embedded in a board according to the present embodiment, and FIG. 14 is an exploded perspective view of a probe according to the present embodiment.

Figure 13:
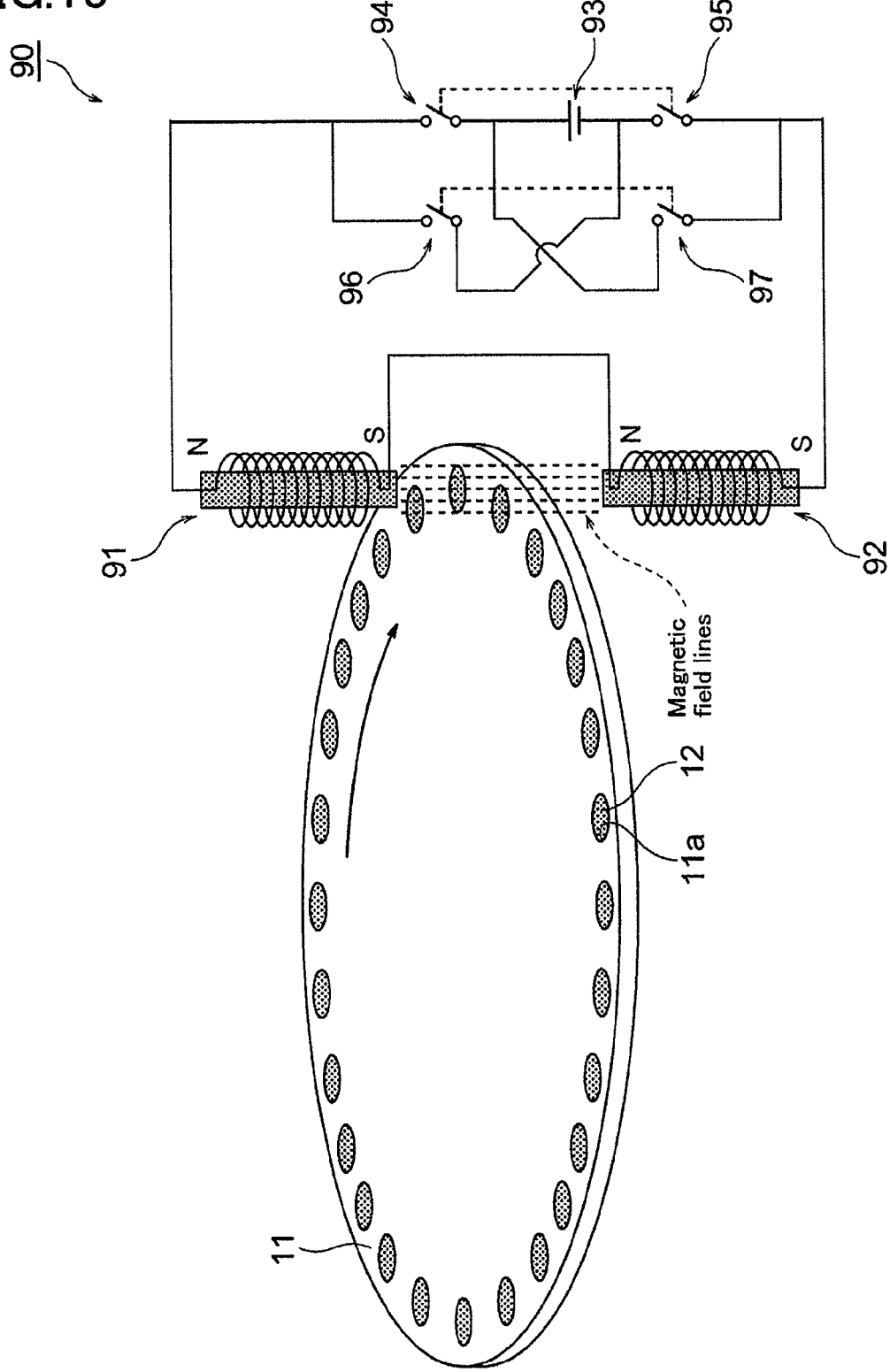
FIG. 13 is a diagram illustrating a method for magnetizing magnetic materials embedded in a board according to the embodiment of the present invention.

Initially, in step S10 of FIG. 12, magnetic materials 12 having not been magnetized are inserted respectively into a plurality of insertion openings 11a formed in a board 11 (refer to FIG. 13). As the material of which the magnetic materials 12 are composed, for example, ferromagnetic materials, such as iron, nickel, cobalt and the like, alloys containing ferromagnetic materials, materials containing oxides, such as ferrite and the like, or materials containing rare earths, such as neodymium and the like, etc.

Note that the board 11 is intended to mean a concept including any board, such as plate-like, sheet-like, or film-like board, which may constitute the probe 10, and the concept specifically includes the above-described membrane board 20, first anisotropic conductive board 30, pitch conversion board 40, second anisotropic conductive board 50, and performance board 60. The board 11 according to the present embodiment corresponds to one example of the board according to the present invention.

Also note that the insertion openings 11a are intended to mean a concept including the insertion openings 21a, 34a, 40a, 54a, and 60a formed in the respective boards 20 to 60. Further note that, as described above, the insertion openings 21a, 34a, 40a, 54a, and 60a of the boards 20 to 60 are formed at the peripheral areas of the respective boards 20 to 60 with substantially equal intervals along the circumferential directions thereof.

Thereafter, in step S20 of FIG. 12, all the magnetic materials 12 embedded in the respective board 10 to 60 are magnetized using a magnetizing circuitry 90 shown in FIG. 13. This magnetizing circuitry 90 comprises, as shown in the same figure, a pair of electromagnets 91 and 92, a power source 93 for supplying electrical power to the electromagnets 91 and 92, and four switches 94 to 97 for turning on/off the power supply from the power source 93 to the electromagnets 91 and 92 and for inverting the magnetic poles of the electromagnets 91 and 92.

According to the present embodiment, this magnetizing circuitry 90 is used for magnetizing the magnetic materials 12 embedded in the board 11, as will be described hereinafter.

That is, the board 11 is initially interposed between the pair of electromagnets 91 and 92, and a magnetic material 12 is positioned between the electromagnets 91 and 92. Then, the first and second switches 94 and 95 are turned on. Due to this, the magnetic field is generated between the electromagnets 91 and 92 thereby magnetizing that magnetic material 12.

Subsequently, after turning off the first and second switches 94 and 95, the board 11 is rotated by a certain amount, and the next magnetic material 12 is positioned between the electromagnets 91 and 92. Then, the third and fourth switches 96 and 97 are turned on. Due to this, the magnetic field which is inverted against the above is generated between the electromagnets 91 and 92 thereby magnetizing that magnetic material 12.

In turn, after turning off the third and fourth switches 96 and 97, the board 11 is rotated by the certain amount, and the magnetic material 12 after the next is positioned between the electromagnets 91 and 92. Then, the first and second switches 94 and 95 are turned on. Due to this, the magnetic field which is further inverted against the above is generated between the electromagnets 91 and 92 thereby magnetizing that magnetic material 12.

In such a manner, by repeating the magnetization of the magnetic material 12 and the rotation of the board 11, all the magnetic materials 12 embedded in the board 11 are magnetized. In this regard, adjacent magnet materials 12 are magnetized so that mutually different magnetic poles are directed in the same direction, by alternately turning on/off the first and second switches 94 and 95 and the third and fourth switches 96 and 97.

After completing the magnetization of the magnetic materials 12 for all the boards 20 to 60, the boards 20 to 60 are stacked as shown in step S30 of FIG. 12. At this time, as shown in FIG. 14, the first and second magnets 25 and 35 attract each other thereby the membrane board 20 and the first anisotropic conductive board 30 are accurately positioned in substantially automatic manner.

Similarly, the first anisotropic conductive board 30 and the pitch conversion board 40 are position by the second and third magnets 35 and 45. The pitch conversion board 40 and the second anisotropic conductive board 50 are positioned by the third and fourth magnets 45 and 55. The second anisotropic conductive board 50 and the performance board 60 are positioned by the fourth and fifth magnets 55 and 65.

As described above, according to the present embodiment, at the time of stacking the boards 20 to 60, the boards 20 to 60 are automatically positioned by the magnets 25 to 65 thereby improving the assembling workability of the probe 10.

Although the number of the magnets 25 to 65 provided in the board 20 to 60 is not limited, the larger the number of the magnets 25 to 65 is, the less the accuracy in arranging the magnets 25 to 60 affects upon the accuracy in positioning the boards 20 to 60.

In addition, according to the present embodiment, the magnetic materials 12 are magnetized after being attached to the board 11, and therefore the magnetic materials 12 may be attached to the board 11 without concern for the magnetic poles of magnets, thereby further improving the productivity of the probe 10.

It is to be noted that the embodiment as explained above are described to facilitate understanding of the present invention and are not described to limit the present invention. Therefore, it is intended that the elements disclosed in the above embodiment include all design changes and equivalents to fall within the technical scope of the present invention.

For example, although the above embodiment have been explained such that the magnets 25 to 65 are provided in all the boards 20 to 60, the present invention is not particularly limited to this, and magnets may be provided in a part of boards while the remaining boards may be positioned in a similar manner as the conventional method.

Moreover, although the above embodiment have been explained such that all the first to fifth magnets 25 to 65 are permanent magnets, the present invention is not particularly limited to this. For example, the first to fifth magnets 25 to 65 may be electromagnets.

Alternatively, only magnets of a part of boards (e.g. the performance board 60 with relatively large space) may be electromagnets while the magnets of the remaining boards may be permanent magnets.

Alternatively, in a same board, a part of the magnets may be permanent magnets while the remaining magnets may be electromagnets (i.e. permanent magnets and electromagnets are mixed in a single board).

Moreover, as long as adjacent magnets 25 to 65 are arranged in boards 20 to 60 so that mutually different magnetic poles are directed in the same direction, the arrangement of the magnets 25 to 65 in the boards 20 to 60 is not particularly limited to the circular ring-like arrangement. For example, magnets may be arranged in polygonal ring-like fashion, magnets may be arranged in multiple ring-like fashions, or magnets may be arranged in grid-like fashion.

Furthermore, although the above embodiment have been explained, as an example, the probe 10 of five layers structure comprises the membrane board 20, the first anisotropic conductive board 30, the pitch conversion board 40, the second anisotropic conductive board 50, and the performance board 60, the layers structure of the probe 10 is not particularly limited to this.

Figure 15:
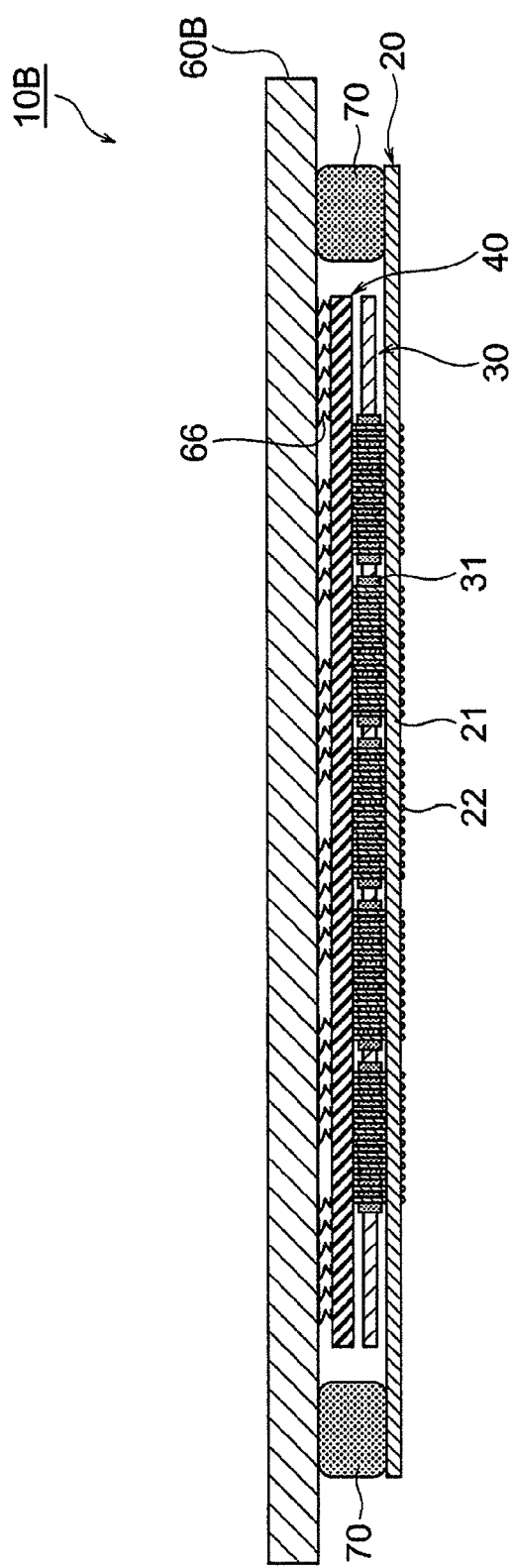
FIG. 15 is a cross sectional view illustrating a modified example of the probe according to the present invention.

For example, as a probe 10B shown in FIG. 15, it may be four layers structure which comprises a membrane board 20, a first anisotropic conductive board 30, a pitch conversion board 40, and a performance board 60B. In this case, note that, instead of the second anisotropic conductive rubbers 51 of the second anisotropic conductive board 50, conical spring coils 66 (spiral contacts) are fixed to the third terminals 61 of the performance board 60B.

Also note that, in this case, the membrane board 20, the first anisotropic conductive board 30, the pitch conversion board 40, and the performance board 60B correspond to one example of the boards in the present invention. Still also note that the membrane board 20 and the pitch conversion board 40 according to the present embodiment correspond to one example of the first board in the present invention, and the first anisotropic conductive board 30 and the performance board 60B according to the present embodiment correspond to one example of the second board in the present invention.

In addition, although the bumps 22 are illustrated as contactors to contact the electrodes 110 of the semiconductor wafer 100 in the above embodiment, the present invention is not particularly limited to this. For example, a probe needle of cantilever-type or a pogo-pin may be used as a contactor.

Figure 16:
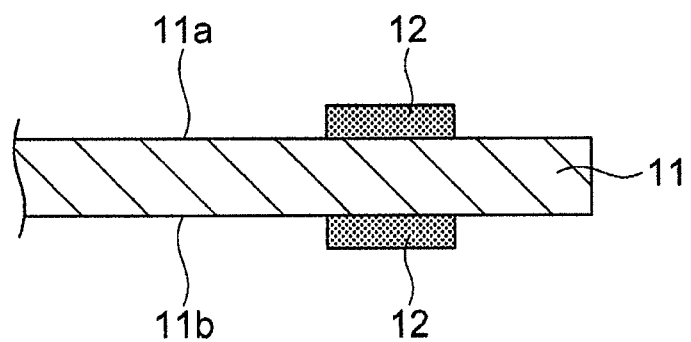
FIG. 16 is a cross sectional view illustrating a modified example of a method for attaching magnetic materials according to the embodiment of the present invention.

In addition, the above embodiment have been explained such that insertion openings are formed in the board 11 and the magnetic materials 12 are embedded into these insertion openings, the present invention is not particularly limited to this. For example, as shown in FIG. 16, a magnetic material 12 may be provided on the upper surface 11a of the board 11, while another magnetic material 12 may be provided on the lower surface 11b of the board 11.

In addition, although the magnetic materials 12 are magnetized using the electromagnets 91 and 92 in the above embodiment, the present invention is not particularly limited to this, and the magnetic materials 12 may be magnetized using permanent magnets.

In addition, although a plurality of the magnetic materials 12 are sequentially magnetized by the pair of electromagnets 91 and 92 while rotating the board 11 in the above embodiment, the present invention is not particularly limited to this, and a plurality the of magnetic materials 12 may be magnetized at the same time using plural pairs of electromagnets.

In addition, although the direction of magnetic field lines generated between the electromagnets 91 and 92 is shifted by switching four switches 94 to 97 in the above embodiment, the present invention is not particularly limited to this. For example, the polarity of the power source 93 in itself may be changed.

DESCRIPTION OF REFERENCE NUMERALS

1 . . . semiconductor wafer testing apparatus
2 . . . test head
3 . . . wafer tray
4 . . . pressure reduction device
10 . . . probe
11 . . . board
12 . . . magnetic materials
20 . . . membrane board
25, 25a, 25b . . . first magnets
30 . . . first anisotropic conductive board
35, 35a, 35b . . . second magnets
40 . . . pitch conversion board
45, 45a, 45b . . . third magnets
50 . . . second anisotropic conductive board
55, 55a, 55b . . . fourth magnets
60 . . . performance board
65, 65a, 65b . . . fifth magnets
90 . . . magnetizing circuitry
100 . . . semiconductor wafer

The invention claimed is:

1. A method of manufacturing a probe, the probe comprising: a first board which has first magnets; and a second board which has second magnets and is positioned on the first board, the first magnets and the second magnets facing each other and arranged so that mutually different magnetic poles face each other, the method comprising:
   attaching first magnetic materials to the first board;
   attaching second magnetic materials to the second board;
   magnetizing the first magnetic materials attached to the first board so as to form the first magnets;
   magnetizing the second magnetic materials attached to the second board so as to form the second magnets; and
   positioning the first board and the second board with respect to each other and stacking the first board and the second board by making the first magnets and the second magnets face each other.

2. The method of manufacturing the probe as set forth in claim 1, wherein
   the attaching the first magnetic materials includes inserting the first magnetic materials into first penetrating openings in the first board, and
   the attaching the second magnetic materials includes inserting the second magnetic materials into second penetrating openings in the second board.

3. The method of manufacturing the probe as set forth in claim 1, wherein
   the magnetizing the first magnetic materials includes magnetizing the first magnetic materials adjacent to each other so that mutually different magnetic poles are directed in a same direction, and
   the magnetizing the second magnetic materials includes magnetizing the second magnetic materials adjacent to each other so that mutually different magnetic poles are directed in a same direction.

4. The method of manufacturing the probe as set forth in claim 3, wherein
   the attaching the first magnetic materials includes arranging the first magnetic materials so that the first magnetic materials are disposed annularly in the first board, and
   the attaching the second magnetic materials includes arranging the second magnetic materials so that the second magnetic materials are disposed annularly in the second board.

5. The method of manufacturing the probe as set forth in claim 1, wherein the attaching the first magnetic materials includes arranging the first magnetic materials so that the first magnetic materials are disposed annularly in the first board, the attaching the second magnetic materials include arranging the second magnetic materials so that the second magnetic materials are disposed annularly in the second board, the magnetizing the first magnetic materials includes rotating the first board so as to sequentially magnetize the first magnetic materials, and the magnetizing the second magnetic materials includes rotating the second board so as to sequentially magnetize the second magnetic materials.

6. The method of manufacturing the probe as set forth in claim 1, wherein the first board is a membrane board having contactors and an insulating sheet that holds the contactors, or a first wiring board having a first insulating substrate and first terminals on the first insulating substrate, and the second board is an anisotropic conductive board having an anisotropic conductive elastic body and a frame that holds the anisotropic conductive elastic body, or a second wiring board having a second insulating substrate and second terminals on the second insulating substrate.

* * * * *